(12) United States Patent
Jung et al.

(10) Patent No.: US 9,065,703 B2
(45) Date of Patent: Jun. 23, 2015

(54) RECEIVER USING IMPEDANCE SHAPING

(71) Applicant: GCT Semiconductor, Inc., San Jose, CA (US)

(72) Inventors: Yeon-jae Jung, Seoul (KR); Deok-hee Lee, Seoul (KR); Seung-wook Lee, Seoul (KR)

(73) Assignee: GCT Semiconductor, Inc., San Jose, CA (US)

( * ) Notice: Subject to any disclaimer, the term of this patent is extended or adjusted under 35 U.S.C. 154(b) by 105 days.

(21) Appl. No.: 14/060,467

(22) Filed: Oct. 22, 2013

(65) Prior Publication Data
US 2014/0112418 A1    Apr. 24, 2014

(30) Foreign Application Priority Data

Oct. 22, 2012 (KR) .......................... 10-2012-0117374

(51) Int. Cl.
| | |
|---|---|
| H04B 1/16 | (2006.01) |
| H04L 25/08 | (2006.01) |
| H04B 1/18 | (2006.01) |
| H03F 1/08 | (2006.01) |
| H03F 3/45 | (2006.01) |

(52) U.S. Cl.
CPC ...... *H04L 25/08* (2013.01); *H04B 1/18* (2013.01); *H03F 1/086* (2013.01); *H03F 3/4521* (2013.01); *H03F 3/45475* (2013.01); *H03F 3/45636* (2013.01); *H03F 2203/45318* (2013.01); *H03F 2203/45526* (2013.01); *H03F 2203/45648* (2013.01); *H03F 2203/45692* (2013.01)

(58) Field of Classification Search
CPC .. H03F 2200/165; H04B 1/1036; H04B 1/10; H04B 1/1027
USPC .................. 455/334, 286, 213, 307, 285, 293
See application file for complete search history.

(56) References Cited

U.S. PATENT DOCUMENTS

| | | | |
|---|---|---|---|
| 7,899,426 B2 * | 3/2011 | Tasic et al. ..................... | 455/286 |
| 8,224,275 B2 * | 7/2012 | Mirzaei et al. ............. | 455/188.1 |
| 8,655,299 B2 * | 2/2014 | Mirzaei et al. ................ | 455/307 |
| 8,666,351 B2 * | 3/2014 | Mirzaei et al. ................ | 455/307 |
| 8,725,105 B2 * | 5/2014 | Tsai et al. ..................... | 455/341 |

FOREIGN PATENT DOCUMENTS

| | | |
|---|---|---|
| JP | 2007-174399 | 7/2007 |
| KR | 10-2007-0043988 A | 4/2007 |

OTHER PUBLICATIONS

Office Action from the Korean Patent Office, issued on Feb. 22, 2013.

* cited by examiner

*Primary Examiner* — Sonny Trinh
(74) *Attorney, Agent, or Firm* — Muir Patent Law, PLLC

(57) ABSTRACT

A receiver includes a mixer configured to convert a radio frequency (RF) signal into a baseband, an impedance shaping unit configured to shape a magnitude of load impedance seen in an output terminal of the mixer in a frequency band of an interference signal converted into the baseband so as to reduce the magnitude of the load impedance, and a transimpedance amplifier configured to amplify the signal converted into the baseband.

20 Claims, 10 Drawing Sheets

(a)

(b)

(c)

RECEIVER USING IMPEDANCE SHAPING

CROSS-REFERENCE TO RELATED APPLICATION

This application claims priority to and the benefit of Korean Patent Application No. 10-2012-0117374, filed on Oct. 22, 2012, the disclosure of which is incorporated herein by reference in its entirety.

BACKGROUND

1. Field of the Invention

The present disclosure relates to a receiver using impedance shaping.

2. Discussion of Related Art

In a frequency division multiple access method such as code division multiple access (CDMA) or frequency division-long term evolution (FD-LTE), receiver signals and transmitter signals are handled at the same time, and even in a time division multiple access method such as global system for mobile communication (GSM) or time division LTE (TD-LTE), receiver signals and transmitter signals are handled at a predetermined time interval. Thus, interference signals in receiver frequency band and/or transmitter signals in transmitter frequency band, act as the interference to a receiver. Here, in this disclosure, interference signals in a receiver band and transmitter leakage signals to a receiver band, may be collectively referred to as interference signals. In order to remove such interference signals, a surface acoustic wave (SAW) filter may be generally used. Electrical signals input through the SAW filter are converted into a mechanical wave in a piezoelectric device, the converted mechanical wave is delayed while being propagated along the device, and then the delayed mechanical wave is reconverted into the electrical signals by an electrode. Because of a configuration of such a SAW filter, the SAW filter may not be integrated in an integrated circuit (IC) to be implemented.

In addition, receiver signals and transmitter signals are combined at a duplexer, which has a limited transmitter to receiver isolation in a transmitter frequency band. Here, transmitter signals having a high power level of about 20 dBm or higher are leaked to the receiver port of the duplexer with its power being attenuated by 50 dB or lower. Receiver signals having a low power level of about −100 dBm or lower are received by a receiver terminal with transmitter leakage signals having a high power level of −25 dBm or higher, so that intermodulated signals are generated to cause degradation in receiver quality of the receiver terminal. In order to prevent performance degradation due to such intermodulated signals, a receiver terminal having high linearity is required. Such a receiver terminal may be generally implemented as a low noise amplifier (LNA) and a SAW filter. Here, generally, signals from a duplexer may be input to an LNA within an IC, output signals of the LNA may be input to the SAW filter positioned outside the IC, and then the output signals may be input to the IC again.

As described above, since the SAW filter cannot be integrated in an IC due to its structural characteristics, the output signals of the LNA should be input to the SAW filter outside the IC and the output signals of the SAW filter should be input to the IC again, and therefore signal characteristics are deteriorated and manufacturing process costs of a receiver terminal are increased.

SUMMARY OF THE INVENTION

Embodiments of the present invention are directed to a receiver terminal which has high linearity without deteriorating signal characteristics and increasing costs.

Embodiments of the present invention are also directed to a receiver terminal which has high linearity without using a surface acoustic wave (SAW) filter.

Embodiments of the present invention are also directed to a receiver terminal which may be integrated in an integrated circuit (IC).

According to an aspect of the present invention, there is provided a receiver including: a mixer configured to convert a radio frequency (RF) signal into a baseband; an impedance shaping unit configured to shape a magnitude of load impedance seen in an output terminal of the mixer in a frequency band of an interference signal converted into the baseband so as to reduce the magnitude of the load impedance; and a trans-impedance amplifier configured to amplify the signal converted into the baseband.

BRIEF DESCRIPTION OF THE DRAWINGS

The above and other objects, features, and advantages of the present disclosure will become more apparent to those of ordinary skill in the art by describing in detail exemplary embodiments thereof with reference to the accompanying drawings, in which.

DETAILED DESCRIPTION OF EXEMPLARY EMBODIMENTS

Figure 1:
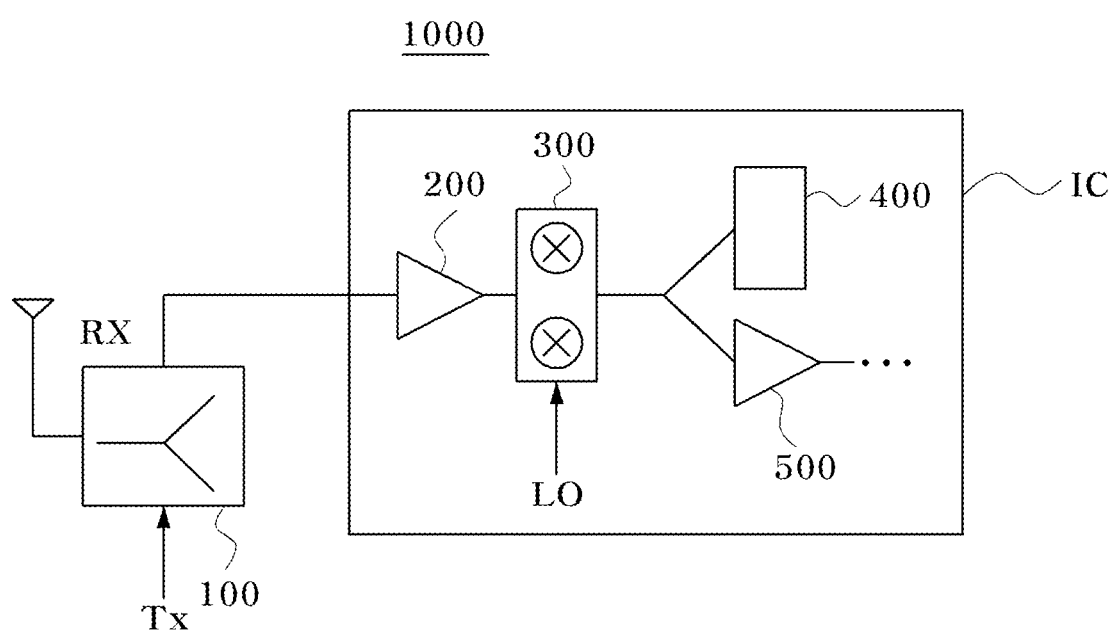
FIG. 1 is a block diagram illustrating a receiver 1000 according to an embodiment of the present invention.

The present invention may be modified in various manners and may have various embodiments, so that specific embodiments are intended to be illustrated in the drawings and described in detail in the present specification. However, it should be understood that the present disclosure is not intended to limit the specific embodiments and the present invention includes all changes, equivalents, or modifications included in the spirit and scope of the present disclosure.

It should be understood that, in the terms used in the present specification, a singular expression includes a plural expression unless a description to the contrary is specifically pointed out in context, and the terms such as "include" are merely intended to indicate that features, numbers, steps, operations, components, parts, or combinations thereof are present and are not intended to exclude a possibility that one or more other features, numbers, steps, operations, components, parts, or combinations thereof will be present or added.

Throughout the drawings and the detailed description, unless otherwise described, the same drawing reference numerals will be understood to refer to the same elements, features, and structures. The relative size and depiction of these elements may be exaggerated for clarity, illustration, and convenience.

It will be understood that, although the terms first, second, etc. may be used herein to describe various elements, these elements should not be limited by these terms. Unless indicated otherwise, these terms are only used to distinguish one element from another. For example, a first signal could be termed a second signal, and, similarly, a second signal could be termed a first signal without departing from the teachings of the disclosure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a receiver terminal according to an embodiment of the present invention will be described with reference to the accompanying drawings. FIG. 1 is a block diagram illustrating a receiver 1000 according to an embodiment of the present invention. The receiver according to an embodiment of the present invention includes a mixer 300 configured to convert a radio frequency (RF) signal into a baseband, an impedance shaping unit 400 configured to shape a magnitude of load impedance seen in an output terminal of the mixer in a frequency band of an interference signal converted into the baseband so as to reduce the magnitude of the load impedance, and a trans-impedance amplifier 500 configured to amplify the signal converted into the baseband. According to an embodiment of the present invention, the receiver further includes an antenna, a duplexer 100 configured to combine a transmitter signal and a receiver signal, and a low noise amplifier (LNA) 200. Referring to FIG. 1, the receiver signal received through the antenna is input to the LNA 200 within an integrated circuit (IC) through the duplexer 100. An interference signal as well as a signal desired to be received through the receiver is also introduced into the input signal.

The LNA 200 amplifies the input signal. Since the input signal has a significantly low power level of −100 dBm or lower, a process for amplifying the input signal is required, but the input signal is a signal received together with a lot of noise, and therefore the input signal should be amplified so as to minimize noise. The LNA 200 may be designed based on an operating point and a matching point so as to reduce a noise figure (NF), and include active devices having low noise and high linearity and passive devices having low thermal noise to ensure a low NF. In addition, the LNA 200 amplifies an input signal with high linearity. This is because, when the LNA 200 has low linearity, intermodulated signals generated by third order intermodulation may degrade the quality of the receiver. In general, the LNA 200 differentially outputs signals, but is illustrated as a single ended output in the present invention for short and clear description, except a case in which the LNA 200 is separately shown or described.

Figure 2:
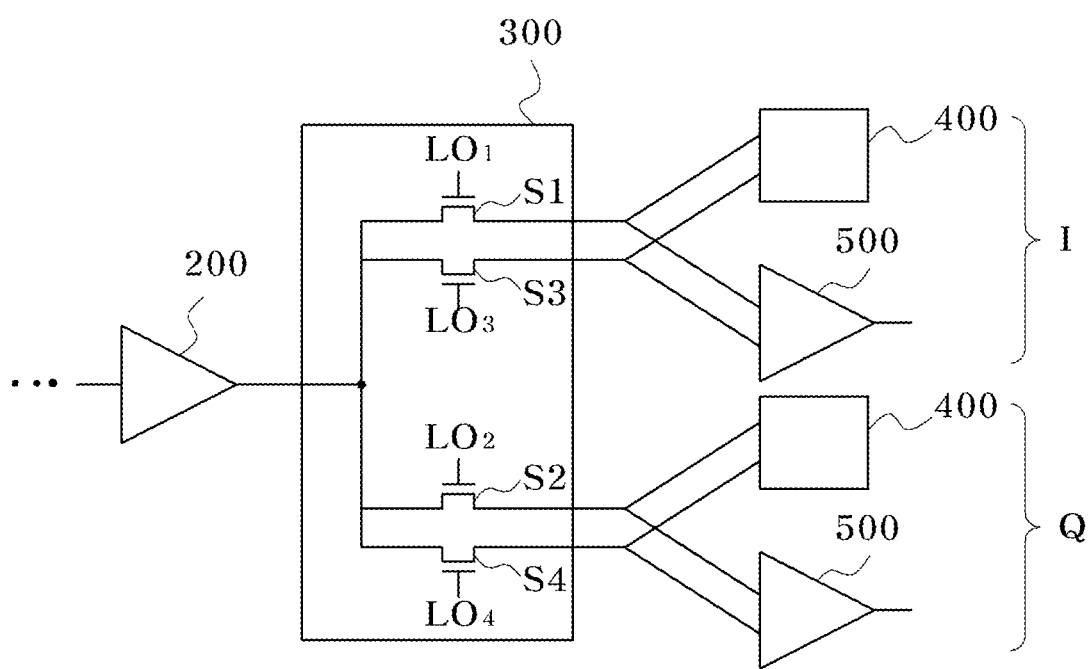
FIG. 2 is a diagram illustrating a summary of a mixer and a summary of a connection structure of a low noise amplifier (LNA) 200, a mixer 300, an impedance shaping unit 400, and a trans-impedance amplifier 500 according to an embodiment of the present invention.

FIG. 2 is a diagram illustrating a summary of a mixer and a summary of a connection structure of an LNA 200, a mixer 300, an impedance shaping unit 400, and a trans-impedance amplifier 500 according to an embodiment of the present invention. The mixer 300 converts, into a baseband, an RF band signal which is amplified by the LNA 200. Referring to FIGS. 1 and 2, according to an embodiment of the present invention, the mixer 300 receives a local oscillation signal (LO) to down-convert the RF band signal into the baseband.

According to an embodiment, as the mixer 300, a double balanced mixer including metal oxide semiconductor field effect transistor (MOSFET) switches S1, S2, S3, and S4 which are controlled by the local oscillation signals LO1 to LO4 as shown in FIG. 2 is illustrated. In the present embodiment, the double balanced mixer is illustrated as the mixer 300, but a single ended mixer or a single balanced mixer may be easily implemented as the mixer 300 by those skilled in the art. As shown in FIG. 2, the mixer outputs signals converted into the baseband to I and Q channels having a phase difference of 90 degrees therebetween, but only a single channel will be herein shown and described for short and clear description except a case in which the channel is separately described or shown.

In the conventional technologies, filtering using a surface acoustic wave (SAW) filter is performed with respect to output signals of the LNA 200. Thus, signals which have passed through the LNA 200 and the SAW filter are input to the mixer, and therefore higher linearity characteristics of the LNA 200 and the SAW filter are required compared to linearity characteristics of the mixer. However, according to an embodiment of the present invention, since the output of the LNA 200 is input to the mixer without being filtered by the SAW filter, the mixer is required to have high linearity.

Figure 3:
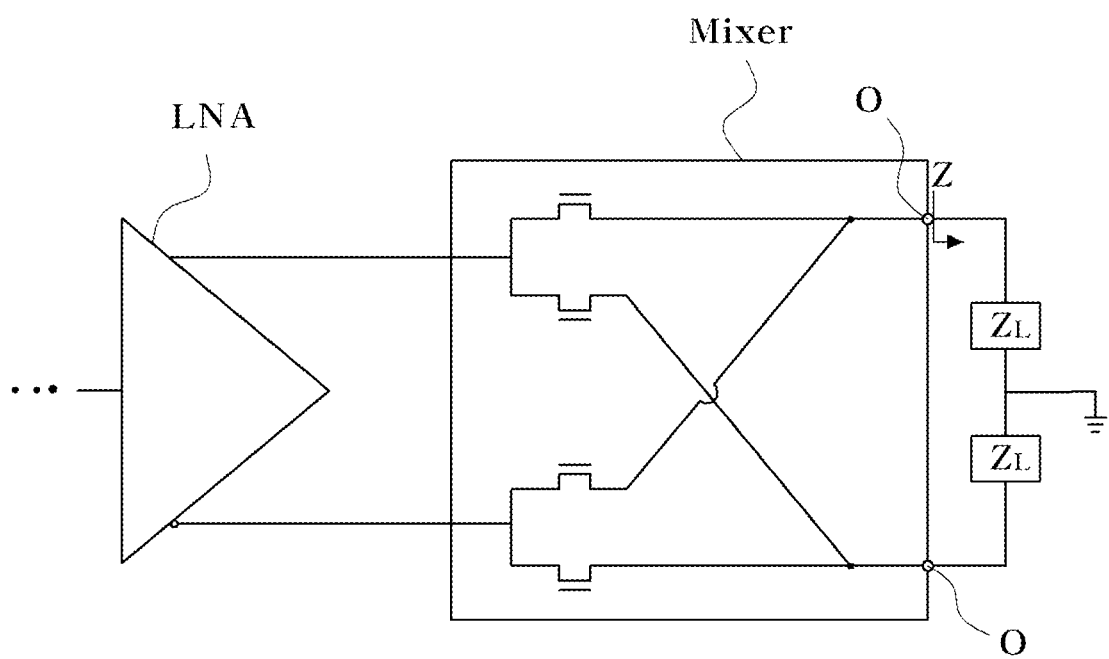
FIG. 3 is a diagram illustrating the load impedance of a mixer.

FIG. 3 is a diagram illustrating the output impedance of a mixer. Referring to FIG. 3, in order not to deteriorate linearity of the mixer, a magnitude (Z) of impedance of a load end which is seen from an output terminal (O) of the mixer should be small. Voltage swing in the output terminal of the mixer is reduced along with a decrease in the magnitude (Z) of the impedance of the load seen from the output terminal (O) of the mixer, and thus linearity of the mixer may be increased. This is because each MOSFET included in the mixer is not an ideal switch and therefore non-ideal characteristics of the MOSFET are manifested in proportional to the voltage swing in the output terminal along with an increase in the voltage swing in the output terminal (O) of the mixer, resulting in deterioration in the linearity of the mixer.

Figure 4:
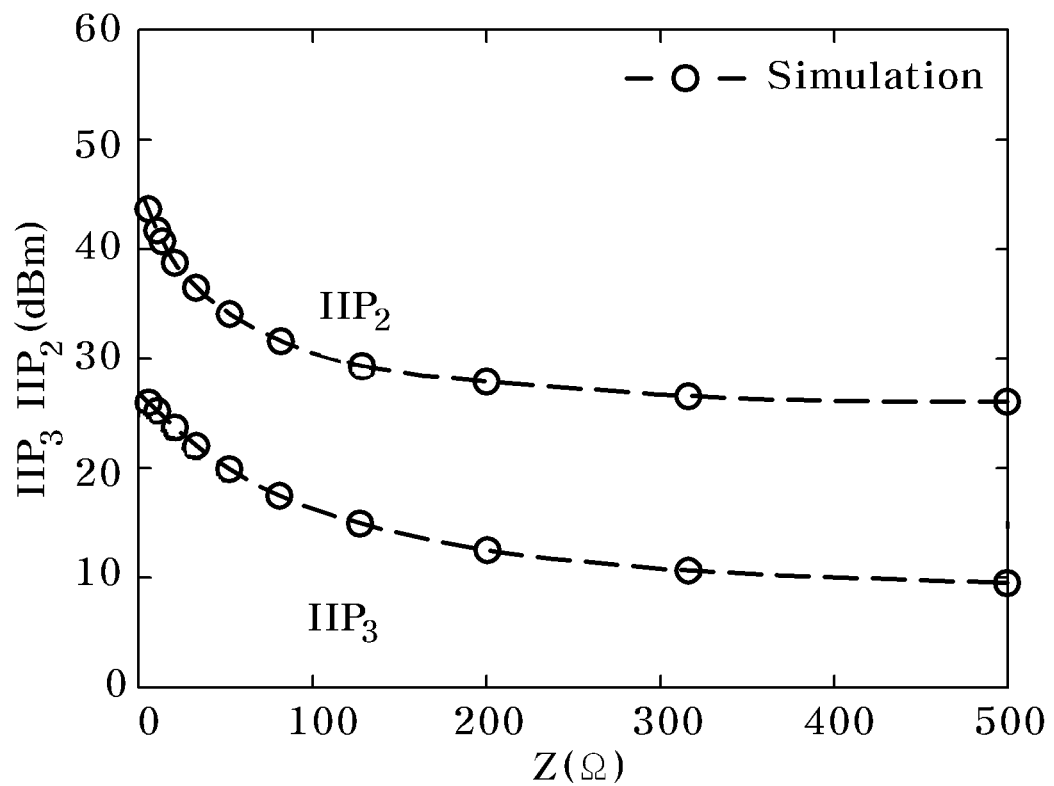
FIG. 4 is a diagram illustrating changes of IIP3 and IIP2 in accordance with load impedance.

Such a result is shown in a relationship between IIP3 and IIP2 which indicate load impedance and linearity shown in FIG. 4. In FIG. 4, a case in which a second harmonic intersection IIP2 of an intermodulated signal and a third harmonic intersection IIP3 thereof are increased along with a decrease in the impedance (Z) of the load seen from the output terminal of the mixer so that linearity is increased is shown. In the present embodiment, the signal down-converted by the mixer should be amplified using an amplifier with low input impedance, thereby maintaining the linearity of the mixer. A voltage mode amplifier that receives a voltage signal and outputs the voltage signal has high input impedance due to its characteristics, and therefore in the present invention, connection between the voltage mode amplifier and the output terminal of the mixer 300 causes deterioration of the linearity of the mixer. In order not to deteriorate linearity characteristics of the mixer 300, a trans-impedance amplifier (TIA) having low input impedance is connected to the output terminal of the mixer 300 as shown in FIGS. 1 and 2.

Figure 5:
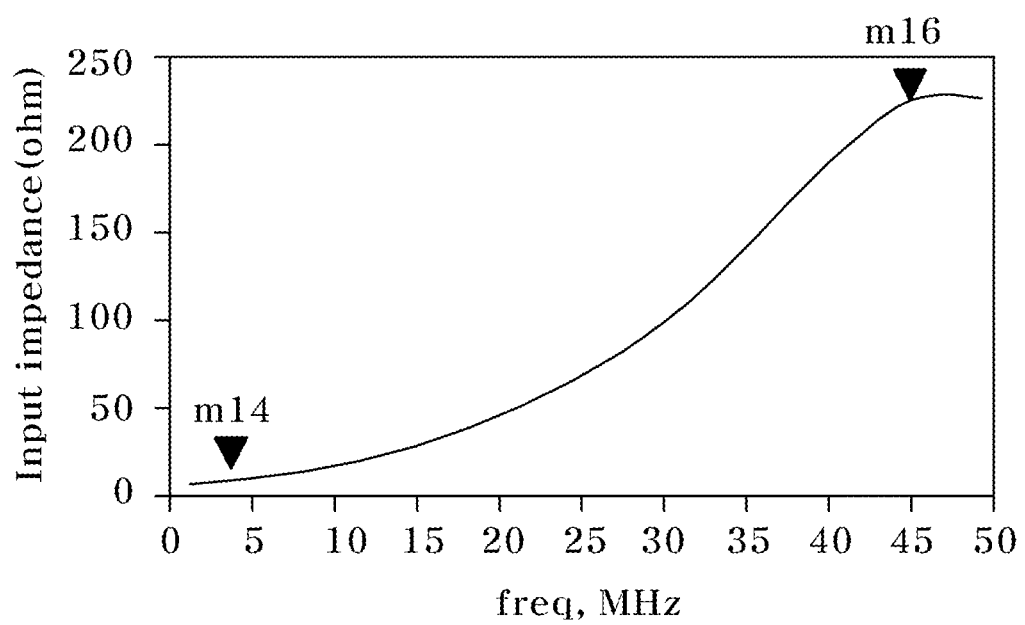
FIG. 5 is a diagram illustrating a change in input impedance in accordance with frequencies of a trans-impedance amplifier in accordance with frequencies.

FIG. 5 is a diagram illustrating a change in input impedance in accordance with frequencies of a trans-impedance amplifier. Referring to FIG. 5, it can be seen that input impedance of the trans-impedance amplifier at a frequency band (m14) including signals desired to be received through a receiver is lower than that in other frequency domains. However, input impedance at a frequency band (m16) in which an interference signal converted into a baseband is located is higher than that in other frequency domains. That is, the input impedance of the trans-impedance amplifier in the frequency band including the signal desired to be received through the receiver is low enough for the mixer to maintain high linearity, but the input impedance in the frequency band including the interference signal is higher than that in other frequency bands, and therefore the input impedance in the frequency band including the interference signal may be amplified with a large amplitude even using the trans-impedance amplifier to cause a non-ideal characteristic expression of the MOSFET switch included in the mixer, resulting in deterioration in the linearity of the mixer.

Figure 6:
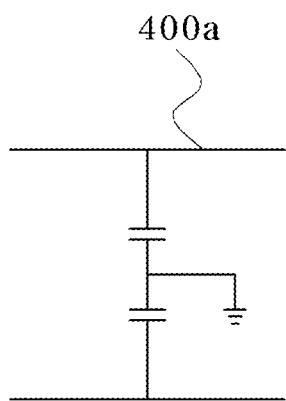
FIGS. 6A, 6B, and 6C are diagrams illustrating an example of implementing an impedance shaping unit.
Figure 6:
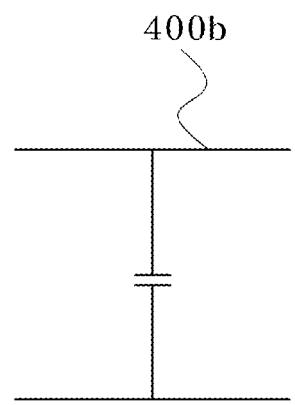
Figure 6:
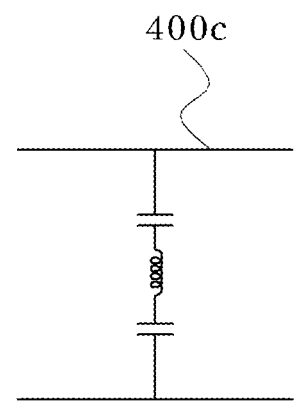

Referring to FIGS. 1 and 2, in an embodiment of the present invention, the impedance shaping unit 400 is connected to the output terminal of the mixer 300. The impedance shaping unit 400 reduces a magnitude of load impedance seen in the output terminal of the mixer in the frequency band of the interference signal converted into the baseband. FIGS. 6A, 6B, and 6C are diagrams illustrating an example of implementing an impedance shaping unit. As an example, referring to FIG. 6A, an impedance shaping unit 400a may be implemented as a capacitor which is connected to a balanced output terminal of the mixer 300 at its one end and connected in the form of a grounded load at its the other end. Referring to FIG. 6B, an impedance shaping unit 400b may be implemented as a floating capacitor which is connected between the balanced output terminals of the mixer. When implementing the impedance shaping unit in the form of the floating capacitor shown in FIG. 6B, it is possible to reduce an area occupied in an integrated circuit (IC) compared to a case of implementing the impedance shaping unit according to another embodiment.

Referring to FIGS. 6A and 6B, the impedance shaping units 400a and 400b are a capacitive load, and a magnitude of impedance of the impedance shaping unit is represented as $$|Z| = \frac{1}{2\pi fC}$$

(here, f denotes a frequency and C denotes a capacitance). Thus, the impedance of the impedance shaping unit itself may be reduced along with an increase in the frequency.

$$R_1 // R_2 = \frac{R_1 \times R_2}{R_1 + R_2} = \frac{R_2}{1 + \frac{R_2}{R_1}} \cong R_2, R_1 \gg R_2 \quad \text{[Equation 1]}$$

Referring to Equation 1, a parallel resistance value of two resistors R1 and R2 connected in parallel is calculated. In Equation 1, in a case in which any one resistance value R1 is greater than the other resistance value R2, an equivalent resistance value approximates the smaller resistance value of R2 when R1 and R2 are connected in parallel.

Figure 7A:
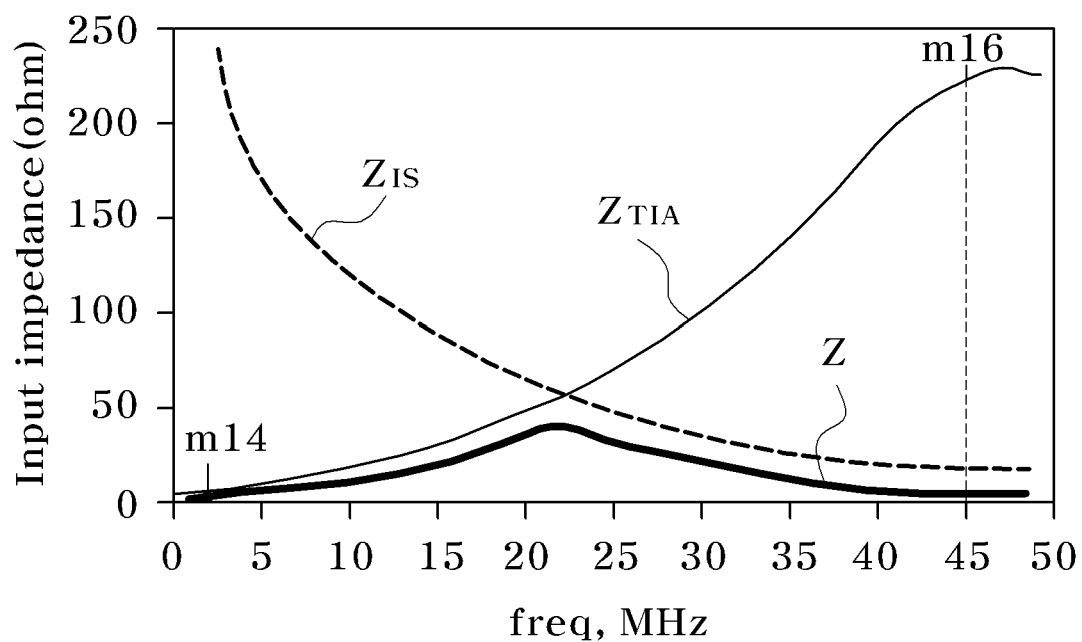
FIGS. 7A and 7B are diagrams illustrating a magnitude of input impedance ($Z_{TIA}$) of a trans-impedance amplifier in accordance with a change in frequencies, a magnitude of impedance ($Z_{IS}$) of an impedance shaping unit, and a change in a magnitude of synthetic impedance (Z) between the input impedance ($Z_{TIA}$) of the trans-impedance amplifier and the impedance ($Z_{IS}$) of the impedance shaping unit.
Figure 7B:
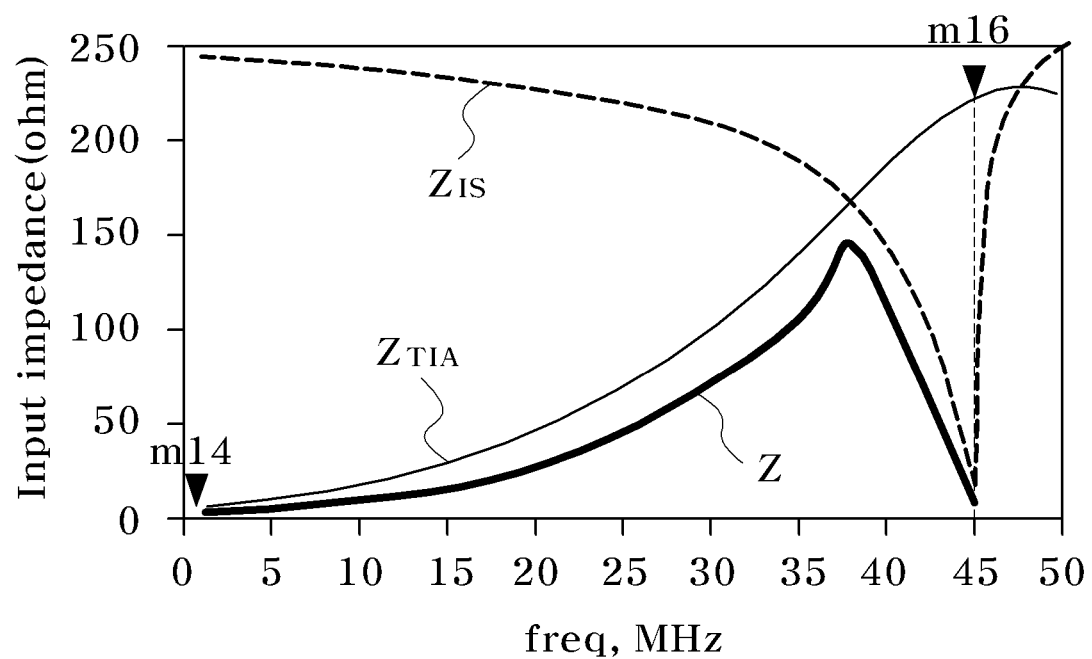

FIGS. 7A and 7B are diagrams illustrating a magnitude of input impedance ($Z_{TIA}$) of a trans-impedance amplifier in accordance with a change in frequencies, a magnitude of impedance ($Z_{IS}$) of an impedance shaping unit, and a change in a magnitude of synthetic impedance (Z) between the input impedance ($Z_{TIA}$) of the trans-impedance amplifier and the impedance ($Z_{IS}$) of the impedance shaping unit. Referring to FIG. 7A, a magnitude of the input impedance ($Z_{TIA}$) of the trans-impedance amplifier is greater in a frequency domain (m16) in which an interference signal is located compared to other frequency domains as described in FIG. 5. However, the magnitude of the impedance ($Z_{IS}$) of the impedance shaping units 400a and 400b is reduced along with an increase in the frequencies as described above. Thus, when the impedance shaping unit 400 is connected in parallel to the trans-impedance amplifier 500 in the output terminal of the mixer 300, the magnitude of the synthetic impedance (Z) between the input impedance ($Z_{TIA}$) of the trans-impedance amplifier and the impedance ($Z_{IS}$) of the impedance shaping unit approximates the impedance with the smaller magnitude of $Z_{TIA}$ and $Z_{IS}$, and therefore the magnitude of the synthetic impedance (Z) in the frequency domain in which the interference signal is located may be reduced.

As another embodiment, referring to FIG. 6C, an impedance shaping unit 400c may be an inductor and a capacitor which are connected to the output terminal of the mixer 300. Referring to FIG. 7B, the impedance shaping unit 400c according to the present embodiment includes an inductor and a capacitor which are connected in series. When the impedance of the inductor and the capacitor which are connected in series is $Z_{IS}$, a magnitude of the impedance may be represented as the following Equation 2.

$$|Z_{IS}| = \frac{4\pi^2 f^2 LC - 1}{2\pi f}, [\Omega] \quad \text{[Equation 2]}$$

Equation 2 is represented as a trajectory of $Z_{IS}$ shown by a dotted line in FIG. 7B. In addition, as can be seen from Equation 2, a frequency making $Z_{IS}$ to zero may exist, and this is a frequency making numerator of $Z_{IS}$ to zero. When this frequency is $f_o$, $f_o$ is obtained through the following Equation 3.

$$f_o = \frac{1}{2\pi\sqrt{LC}} [\text{Hz}] \quad \text{[Equation 3]}$$

Thus, when $f_o$ is made coincident with the frequency in which the interference signal is located by adjusting an inductance (L) and a capacitance (C), the magnitude of the synthetic impedance may be shaped into zero in the frequency band (m16) in which the interference signal is located as shown in FIG. 7B. However, the inductor and the capacitor included in the impedance shaping unit according to the present embodiment have non-ideal characteristics having a loss, and therefore in fact, the MAGNITUDE of the synthetic impedance may be formed so as to approximate zero.

In the above-described embodiments, the capacitor included in the impedance shaping unit 400 may be implemented as a capacitor having a variable capacitance capable of adjusting a capacitance. Using the capacitor having such a variable capacitance, high linearity may be maintained even with respect to several frequency bands. By using the impedance shaping using such an impedance shaping unit, it is possible to prevent degradation of linearity characteristics of the mixer caused by the interference signal and to form a receiver as a single chip without introduction of the SAW filter.

In an embodiment, the MOSFET switches S1, S2, S3, and S4 included in the mixer 300 are controlled by local oscillation signals LO1, LO2, LO3, and LO4. When there is a duration in which the local oscillation signals LO1, LO2, LO3, and LO4 are overlapped with each other, interference between an I path and a Q path occurs. That is, when a mismatch occurs between the two paths, gain/phase mismatches occur between the I path and the Q path by the interference to cause degradation of receiver performance. In addition, noise of the trans-impedance amplifier is amplified by a change in a feedback factor of the trans-impedance amplifier during an overlapped period, and therefore the entire noise figure of the receiver may be deteriorated.

Figure 8:
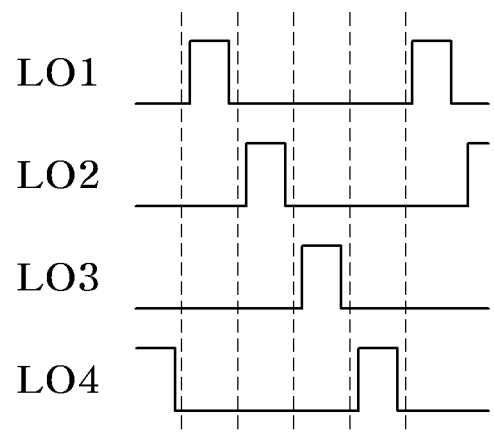
FIG. 8 is a diagram illustrating an example of a local oscillation signal for controlling a switch of a mixer 300 according to an embodiment of the present invention.

FIG. 8 is a diagram illustrating an example of a local oscillation signal for controlling a switch of a mixer 300 according to an embodiment of the present invention. Referring to FIG. 8, the oscillation signals LO1, LO2, LO3, and LO4 which control switches of the mixer 300 according to an embodiment of the present invention have a duty ratio in which ON durations are not overlapped with each other. The MOSFET switches S1 and S3 included in the I path of the mixer are controlled by the oscillation signals LO1 and LO3, and the oscillation signals LO1 and LO3 have a phase difference of 180 degrees therebetween. In the same manner, the oscillation signals LO2 and LO4 which control the MOSFET switches S2 and S4 included in the Q path of the mixer have a phase difference of 180 degrees therebetween. In addition, the LO1 and the LO2 have a phase difference of 90 degrees therebetween, and the LO3 and the LO4 have a phase difference of 90 degrees therebetween, and therefore an I channel and a Q channel have a phase difference of 90 degrees therebetween. Since such local oscillation signals are used, interference between the I path and the Q path is minimized, noise amplification of the trans-impedance amplifier is removed, and the entire gain of the receiver is increased.

Referring to FIGS. 1 and 2, in an embodiment of the present invention, the trans-impedance amplifier 500 is connected to the output terminal of the mixer 300. When an output signal of the mixer is amplified by a voltage mode amplifier, voltage swing of the output signal of the mixer is increased by high input impedance, and therefore non-ideal characteristics of the MOSFET switch of the mixer are manifested, thereby preventing deterioration of linearity of the mixer using the trans-impedance amplifier 500 having low input impedance as described above.

The trans-impedance amplifier 500 is designed to have low thermal noise and low flicker noise so that low noise characteristics are maintained. In addition, the trans-impedance amplifier 500 should be sufficiently operated even with a low supply voltage due to a miniaturized process, and input impedance in a receiver band should be sufficiently low as described above.

Figure 9:
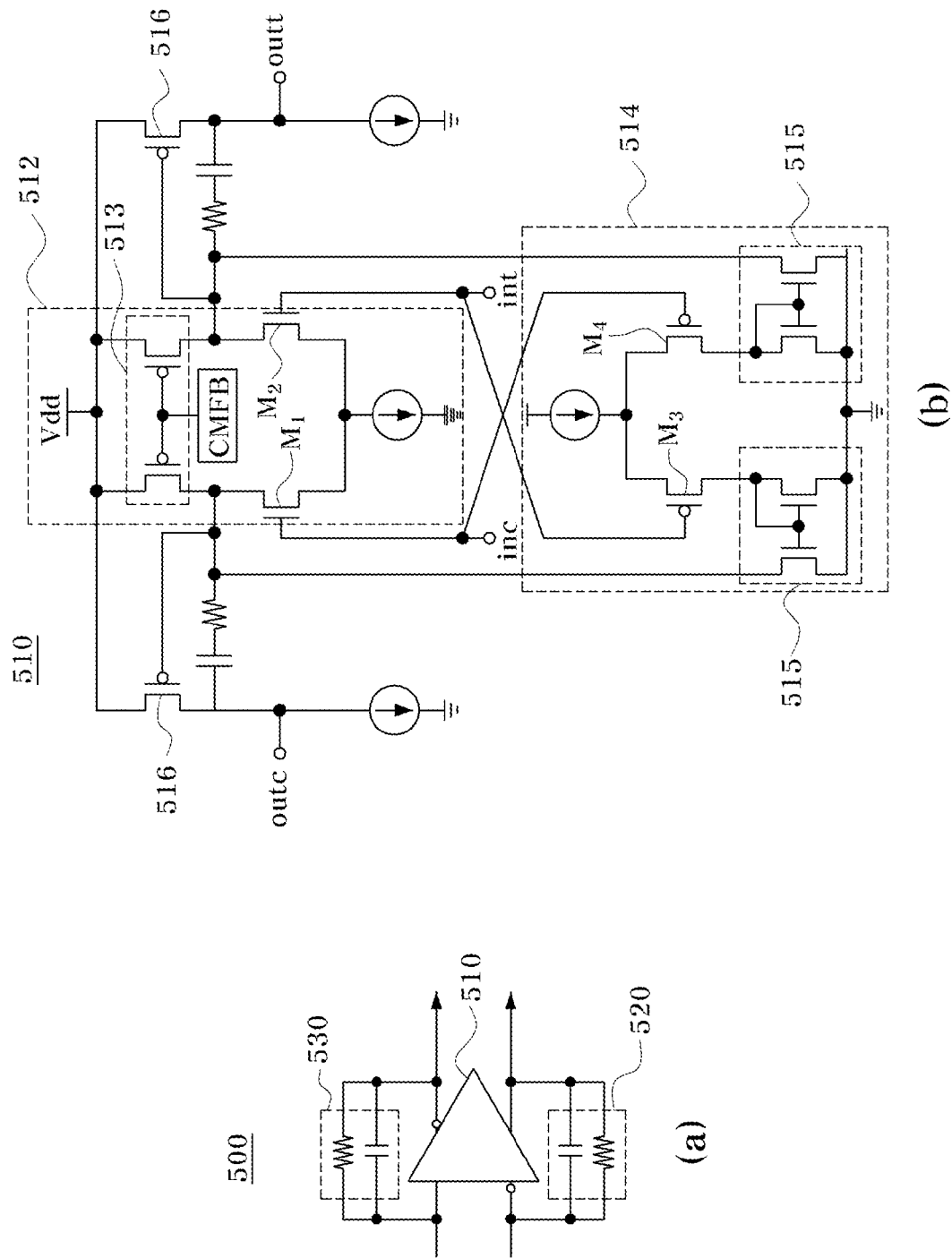
FIGS. 9A and 9B are diagrams illustrating a summary of a trans-impedance amplifier according to an embodiment of the present invention.

FIGS. 9A and 9B are diagrams illustrating a summary of a trans-impedance amplifier according to an embodiment of the present invention. Referring to FIGS. 9A and 9B, the trans-impedance amplifier 500 according to an embodiment of the present invention includes an operational amplifier 510 configured to include a inverting input terminal and a non-inverting input terminal, a first feedback unit 520 configured to feedback the non-inverted output signal to a inverting input terminal in such a manner that a resistor and a capacitor are connected in parallel, and a second feedback unit 530 configured to feedback the inverted output signal to a non-inverting input terminal in such a manner that the resistor and the capacitor are connected in parallel. In an embodiment, the operational amplifier 510 includes a first stage in which an nMOS differential pair 512 and a pMOS differential pair 514 are connected in parallel, and a second stage including a pMOS amplifier 516 for amplifying an output of the first stage.

Referring to FIG. 9A, in the operational amplifier 510, the inverting input and the non-inverting input are respectively connected to a inverted output and a non-inverted output of a mixer balance output. As described above, the operational amplifier 510 and the impedance shaping unit 400 are connected in parallel in the output terminal of the mixer. The non-inverted output of the operational amplifier 510 is fed back through the first feedback unit 520 as the inverting input, and the inverted output thereof is fed back through the second feedback unit 530 as the non-inverting input. Both the first and second feedback units have a configuration in which the resistor and the capacitor are connected in parallel, thereby preventing the trans-impedance amplifier from being saturated by the interference signal.

The nMOS differential pair 512 of the operational amplifier 510 includes nMOS transistors M1 and M2 which receive differential input signals and a pMOS active load 513, and in transistors constituting the active load 513, a gate is connected to a common mode voltage feedback (CMFB) circuit of the trans-impedance amplifier. Thus, an output operating point of the trans-impedance amplifier is controlled by the CMFB circuit. The nMOS differential pair 512 of the operational amplifier 510 is connected in parallel to the pMOS differential pair 514. The pMOS differential pair 514 includes pMOS transistors M3 and M4 which receive differential input signals and an nMOS transistor constituting the active load. As an example, an active load 515 of the pMOS differential pair supplies, to an nMOS differential pair output terminal, a current obtained by mirroring a reference current using a current mirror.

The operational amplifier 510 includes the second stage that amplifies the output signal of the first stage. As an example, the second stage comprises PMOS transistor, one electrode of the PMOS transistor is connected to a supply power (Vdd), another electrode is connected to a current source and the current mirror that is the active load of the pMOS differential pair at its the other end, and a gate is connected to the output terminal of the nMOS differential pair.

In this manner, in case of using the operational amplifier to which the pMOS differential pair 514 in addition to the nMOS differential pair 512 are connected in parallel, when there is a change in a common mode output voltage of the trans-impedance amplifier, the endurance to an amount of change in a voltage applied to a common mode input voltage is larger than a case of using only one differential pair. That is, when there occur a change in the common mode output voltage of the trans-impedance amplifier, the occurrence of the change affects the common mode input voltage of the trans-impedance amplifier. Thus, the amount of change in the common mode input voltage of the trans-impedance amplifier becomes large, so that the operational amplifier is deviated from an operating point of the first stage, and therefore malfunction occurs when using only the nMOS differential pair or the pMOS differential pair. In this manner, even though there occur a change in the common mode input voltage, a normal operation may be achieved by using both the nMOS differential pair and the pMOS differential pair.

As described above, according to the embodiments of the present invention, it is possible to prevent deterioration of the linearity of the mixer caused by the interference signal through the impedance shaping using the impedance shaping unit. In addition, the linearity of the mixer may be maintained at a high level, and therefore a receiver may be formed as a single chip without introduction of the SAW filter.

In addition, high linearity may be maintained even with respect to several frequency bands by adjusting a capacitance of a capacitor included in the impedance shaping unit.

In addition, in the oscillation signals that control the switch of the mixer, ON durations are not overlapped with each other. Thus, interference between the I path and the Q path may be minimized, noise amplification of the trans-impedance amplifier may be removed, and the entire gain of the receiver may be increased.

In addition, since the trans-impedance amplifier in which the nMOS differential pair or the pMOS differential pair are connected in parallel is used, even when the amount of change in the common mode input voltage becomes large, so that the operational amplifier maintains an operating point of the first stage, and therefore malfunction does not occur, compared to when using only the nMOS differential pair or the pMOS differential pair is used.

It will be apparent to those skilled in the art that various modifications can be made to the above-described exemplary embodiments of the present disclosure without departing from the spirit or scope of the invention. Thus, it is intended that the present invention covers all such modifications provided they come within the scope of the appended claims and their equivalents.

What is claimed is:

1. A receiver comprising:
    a mixer configured to convert a radio frequency (RF) signal into a baseband;
    an impedance shaping unit configured to shape a magnitude of load impedance seen in an output terminal of the mixer in a frequency band of an interference signal converted into the baseband so as to reduce the magnitude of the load impedance; and
    a trans-impedance amplifier configured to amplify the signal converted into the baseband.

2. The receiver of claim 1, wherein the impedance shaping unit is connected in parallel to the trans-impedance amplifier in the output terminal of the mixer.

3. The receiver of claim 1, wherein the load impedance is the impedance in which input impedance of the impedance shaping unit seen in the output terminal of the mixer and input impedance of the trans-impedance amplifier are synthesized.

4. The receiver of claim 1, wherein the impedance shaping unit includes a grounded capacitor.

5. The receiver of claim 1, wherein the impedance shaping unit includes a floating capacitor.

6. The receiver of claim 1, wherein the impedance shaping unit includes a variable capacitance capacitor.

7. The receiver of claim 1, wherein the impedance shaping unit includes a capacitor electrically connected to an inductor.

8. The receiver of claim 1, wherein the mixer outputs the signal converted into the baseband to two channels having a phase difference of 90 degrees therebetween, and each of the two channels processes a signal in a differential mode.

9. The receiver of claim 8, wherein a switch of any one differential stage of the channel and a switch of another differential stage of the channel are controlled by a local oscillation signal having a phase difference of 180 degrees.

10. The receiver of claim 1, wherein the mixer includes a metal oxide semiconductor field effect transistor (MOSFET) switch, and the switch is controlled by a local oscillation signal having a duty ratio in which ON durations are not overlapped with each other.

11. The receiver of claim 1, wherein the trans-impedance amplifier includes:
    an operational amplifier configured to receive a inverting input signal and a non-inverting input signal and output a inverted output signal and a non-inverted output signal;
    a first feedback unit configured to feedback the non-inverted output signal to a inverting input terminal in such a manner that a resistor and a capacitor are connected in parallel; and
    a second feedback unit configured to feedback the inverted output signal to a non-inverting input terminal in such a manner that the resistor and the capacitor are connected in parallel.

12. The receiver of claim 11, wherein the operational amplifier includes:
    a first stage in which an nMOS differential pair and a pMOS differential pair are connected in parallel; and
    a second stage including a pMOS amplifier for amplifying an output of the first stage.

13. The receiver of claim 11, wherein the nMOS differential pair includes:
    an nMOS amplifier;
    an active load including two pMOS transistors to which a gate is connected; and
    a common mode feedback circuit connected to the gate.

14. A receiver comprising:
    a mixer configured to down-convert a received radio frequency (RF) signal;
    a trans-impedance amplifier configured to be electrically connected to an output of the mixer to amplify an output signal of the mixer; and
    an impedance shaping unit configured to reduce a magnitude of synthetic impedance with input impedance of the trans-impedance amplifier in a frequency band of an interference signal which is electrically connected to the output of the mixer to be down-converted.

15. The receiver of claim 14, wherein the synthetic impedance is the impedance in which input impedance of the impedance shaping unit and input impedance of the trans-impedance amplifier seen in an output terminal of the mixer are synthesized.

16. The receiver of claim 14, wherein the impedance shaping unit includes a grounded capacitor.

17. The receiver of claim 14, wherein the impedance shaping unit includes a floating capacitor.

18. The receiver of claim 14, wherein the impedance shaping unit includes a variable capacitance capacitor.

19. The receiver of claim 14, wherein the impedance shaping unit includes a capacitor electrically connected to an inductor.

20. The receiver of claim 14, wherein the impedance shaping unit is connected in parallel to the trans-impedance amplifier in the output terminal of the mixer.

* * * * *